(12) United States Patent
Endo et al.

(10) Patent No.: US 7,625,808 B2
(45) Date of Patent: Dec. 1, 2009

(54) METHOD FOR MANUFACTURING BONDED WAFER

(75) Inventors: Akihiko Endo, Tokyo (JP); Hideki Nishihata, Tokyo (JP)

(73) Assignee: Sumco Corporation, Tokyo (JP)

( * ) Notice: Subject to any disclaimer, the term of this patent is extended or adjusted under 35 U.S.C. 154(b) by 466 days.

(21) Appl. No.: 10/569,942

(22) PCT Filed: Sep. 1, 2004

(86) PCT No.: PCT/JP2004/012633

§ 371 (c)(1),
(2), (4) Date: Feb. 28, 2006

(87) PCT Pub. No.: WO2005/022610

PCT Pub. Date: Mar. 10, 2005

(65) Prior Publication Data

US 2008/0200010 A1    Aug. 21, 2008

(30) Foreign Application Priority Data

Sep. 1, 2003    (JP)    ............................. 2003-309239

(51) Int. Cl.
H01L 21/30  (2006.01)
H01L 21/44  (2006.01)

(52) U.S. Cl. ........................ 438/455; 438/458; 438/677; 438/977; 257/E21.122

(58) Field of Classification Search ................. 438/455, 438/458, 766, 977; 257/E21.122
See application file for complete search history.

(56) References Cited

U.S. PATENT DOCUMENTS 5,374,564 A    12/1994  Bruel
6,146,979 A *  11/2000  Henley et al. ............... 438/458
6,245,645 B1    6/2001  Mitani et al.
6,255,195 B1 *  7/2001  Linn et al. .................. 438/455
6,335,231 B1 *  1/2002  Yamazaki et al. ........... 438/151
6,344,404 B1 *  2/2002  Cheung et al. .............. 438/513
2006/0014330 A1 * 1/2006  Ichikawa et al. ............ 438/149

(Continued)

FOREIGN PATENT DOCUMENTS

JP    5-211128    *  8/1993

(Continued)

OTHER PUBLICATIONS

U.S. Appl. No. 11/851,065 (Nishihata et al.), filed Sep. 6, 2007 and entitled, "Bonded Wafer and Method of Manufacturing the Same.".

(Continued)

*Primary Examiner*—Alexander G Ghyka
*Assistant Examiner*—Seahvosh J Nikmanesh
(74) *Attorney, Agent, or Firm*—Greenblum & Bernstein, P.L.C.

(57) ABSTRACT

A thickness of silicon oxide film of a wafer for active layer is controlled to be thinner than that of buried silicon oxide film. Consequently, uniformity in film thickness of the active layer of a bonded wafer is improved even if a variation in the in-plane thickness of the silicon oxide film is large at a time of ion implantation. Furthermore, since the silicon oxide film is rather thinner and thereby the ion implantation depth is relatively deeper, damages to the active layer and the buried silicon oxide film caused by the ion implantation can be reduced.

4 Claims, 3 Drawing Sheets

U.S. PATENT DOCUMENTS

2006/0160327 A1 * 7/2006 Barna .................. 438/455

FOREIGN PATENT DOCUMENTS

| JP | 7-249749 | * | 9/1995 |
| JP | 11-186187 | * | 7/1999 |
| JP | 2000-30996 | * | 1/2000 |

OTHER PUBLICATIONS

English language Abstract of JP 11-186187.
English language Abstract of JP 7-249749.
U.S. Appl. No. 10/570,665 to Endo et al., filed Mar. 6, 2006.
U.S. Appl. No. 10/570,669 to Endo et al., filed Mar. 6, 2006.
U.S. Appl. No. 10/570,663 to Endo et al., filed Mar. 6, 2006.
U.S. Appl. No. 10/570,668 to Endo et al., filed Mar. 6, 2006.

* cited by examiner

METHOD FOR MANUFACTURING BONDED WAFER

FIELD OF THE INVENTION

The present invention relates to a method for manufacturing a bonded wafer, and more particularly to a technology for heat treating a semiconductor wafer, which has been ion-implanted with hydrogen and the like at a predetermined depth, to thereby cause cleavage and separation of a part of the semiconductor wafer at the site of ion-implanted area thereof.

DESCRIPTION OF THE PRIOR ART

Recently, the smart cut method as disclosed in the Patent Document 1 has been developed as a method for producing a semiconductor substrate having an SOI (Silicon On Insulator) structure.

In the smart cut method, firstly a wafer for active layer, which has been processed to have an oxide film formed thereon and then ion-implanted with hydrogen (or light element) at a predetermined depth thereof, is bonded with a supporting wafer having no oxide film, and secondly, thus obtained bonded wafer is introduced into a furnace for heat treatment where the bonded wafer is subjected to the heat treatment, so that a part of the active layer wafer may be cleaved and separated at the site of ion-implanted area thereby to form an active layer.

The oxide film (the buried insulating film) to be provided in a top and a back surfaces of the active layer wafer defines a thin film having its thickness as thin as 150 nm, and typically such an oxide film of thin film is formed in a thermal oxidation process. Specifically, this process may be carried out by introducing a silicon wafer into the furnace for oxidation and heating this wafer for a predetermined time at a predetermined temperature. In the thermal oxidation process, the oxide film is primarily made up of a strong bond between silicon and oxygen. The oxide film formed in this method is typically highly densified and has lesser impurities and traps as compared to the oxide film formed in other methods (e.g., CVD process). Further, what characterizes most this oxide film formed in the thermal oxidation is that an interface state is lower.

[Patent Document 1]
Japanese Patent Laid-open Publication No. Hei5-211128

SUMMERY OF THE INVENTION

Problem to be Solved by the Invention

Recently, a device fabricator has imposed a high level of requirement on a wafer manufacturer with respect to the thickness of the active layer of the SOI wafer of thin film defined by the active layer thickness of 0.1 µm or thinner. This is due to the situation that a device including a partial depletion structure has been developed in order to take advantage of the SOI features sufficiently. Specifically, the requirement may be represented, for example, by the thickness of the active layer in a range of 0.02 µm to 0.05 µm and the uniformity in the in-plane film thickness of the active layer (variation in thickness entirely across the active layer) in a range of 5% to 10% by taking the thickness of the active layer as a reference. These requirements for the film thickness of the active layer are similarly applied to a bonded wafer that has been manufactured in the smart cut method.

By the way, a film thickness distribution of the active layer has a correlation with the film thickness distribution of the buried insulating film. This relation will be discussed below with reference to FIGS. 3 to 6.

Specifically, a light element is ion-implanted into a top surface of the active layer wafer through the insulating film (BOX). Due to this fact, a thickness of an insulating film 12a can affect a depth of ion implantation (Rp) of the light element, or in other words, a depth of cleavage in an active layer wafer 10, as shown in FIG. 3. Consequently, in a plane of the active layer wafer 10, an active layer 13 of the produced bonded wafer is thinner in an area having thick insulating film, as shown in FIG. 4. Inversely, the active layer 13 is thicker in the area having thinner insulating film.

Therefore, improving the film thickness uniformity in the insulating film of the active layer wafer is an essential requirement for improving the film thickness uniformity in the active layer.

However, this method has a certain limit in improving the film thickness uniformity of the buried insulating film. This is based on the fact that, if assuming a case by way of example where the active layer wafer 10 is a silicon wafer and an insulating film 12a is a silicon oxide film, a flow of oxygen gas and a temperature in a furnace, which are known as the parameters indicative of a rate of oxide film formation, are not necessarily uniform in the surface of the wafer. This fact may be applied to the case where a vertical furnace, which is used generally, is employed for the formation of thermal oxidation film in the silicon wafer. It is to be noted that as the thickness of the oxide film increases, the nonuniformity in the flow of the oxygen gas and the temperature in the furnace is more distinctive.

Further, in the smart cut method, hydrogen ion is implanted into the active layer wafer 10 via the buried oxide film (buried insulating film) 12a. As a result, thus manufactured bonded SOI wafer is inevitably suffered from the damages generated by the ion implantation in the active layer 13 and the buried oxide film, respectively.

In this regard, if the oxide film has damages, an etching rate of such an oxide film could be high. The oxide film of high etching rate could have a lowered oxide film withstand voltage as compared to an oxide film that has not been ion-implanted.

From the consideration directed to the above facts, the inventors of the present invention has found that if the thickness of the insulating film 12a of the active layer wafer 10 is controlled to be thinner than that of the buried insulating film 12c of the manufactured bonded wafer, not a significant effect on the depth of ion-implantation, Rp, of the light element can be observed, as shown in FIG. 5. They have further found that, in the bonded wafer produced in the smart cut method, such a control of the film thickness of the insulating film can help improve the uniformity in in-plane thickness of the active layer 13, as shown in FIG. 6. It is to be noticed that reference numeral 20 designates a supporting wafer.

An object of the present invention is to provide a method for manufacturing a bonded wafer to be produced in the smart cut method, in which uniformity in the in-plane thickness (in-plane thickness uniformity) of an active layer can be improved and any damages to an active layer and a buried insulating film from ion implantation of a light element can be reduced.

Means to Solve the Problem

A first invention provides a method for manufacturing a bonded wafer, comprising the steps of:

ion-implanting of a light element into a wafer for active layer at a predetermined depth via an insulating film that has been formed thereon to form an ion-implanted area in the active layer wafer;

subsequently bonding the active layer wafer with a supporting wafer having an insulating film formed thereon together as their insulating films facing to each other to produce the bonded wafer; and heat treating the bonded wafer to form bubbles of the light element in the ion-implanted area and thereby induce a cleavage and separation of a part of the bonded wafer defined in the ion-implanted side for forming an active layer.

According to the first invention, the insulating film having a thickness thinner than that of the buried insulating film to be buried in the manufactured bonded wafer is formed on the active layer wafer. Owing to this, in the ion implantation, the light element is ion-implanted into the active layer wafer via this thinner insulating film. Consequently, the uniformity in the in-plane thickness of the active layer after the cleavage can be improved.

If the thickness of the insulating film of the active layer wafer is reduced, the depth of ion implantation of the light element becomes deeper as compared to the case with the thicker insulating film under a condition of the same acceleration voltage used in the ion implantation, and so the damages to the active layer and the insulating film, which will be induced in the ion implantation of the light element can be reduced. Especially, it can work out effectively to reduce the damage to the insulating film that resides in a top surface. This will now be described in more detail.

It has been known theoretically regarding the ion implantation that a level defined specifically by three-quarter of the depth of ion implantation of the light element represents a maximum implantation damage depth. This can be explained by considering an interaction between the implanted ions and atoms constituting a material subject to the implantation (the silicon in the present invention). That is, the ions moving at a high speed tend to slow down their moving speed through repetitive impingement against the silicon atoms, wherein the interaction between the implanted ions and the silicon atoms and thus the damages appear maximum immediately before the ions going to be unmoved, or at a location immediately above the deepest level in the depth of implantation.

It has been also known that if the insulating film is a silicon oxide film, the etching rate in the buried silicon oxide film that has been ion-implanted with the light element is higher than that in the thermal oxidation film in the etching process due to the damages from the ion implantation in the silicon oxide film. The outcome from this implies a deterioration in the withstand voltage property of the insulating film.

The inventors have made, in the light of the above problems, an examination on the thickness of the buried silicon oxide film which provides the silicon oxide film after the ion-implantation and thus the buried silicon oxide film having the etching rate equal to that of the thermal oxidation film.

They have ultimately found that the etching rate of the silicon oxide film that has been ion-implanted (the buried silicon oxide film) is substantially equal to the etching rate of the thermal oxidation film under a specific condition that can satisfy the following formula:

$$0.1Rp = 0.1 \times (tdox + tsoi) > tdox,$$

$$tdox < (1/9) \times tsoi,$$

where tdox is the thickness of the oxide film of the active layer wafer, Rp is the depth of ion implantation and tsoi is the thickness of the active layer.

Specifically, if the thickness of the silicon oxide film of the active layer wafer is made thinner than one-ninth (about 0.11) of the thickness of the active layer, the etching rate of the silicon oxide film after the ion implantation becomes substantially equal to the etching rate of the thermal oxidation film. In other words, if the silicon oxide film is reduced in its thickness to be as thin as one-ninth of the active layer, there would be almost no damage present in the silicon oxide film due to the ion implantation. In this case, the aim for making the thickness of the buried silicon oxide film equal to a predetermined BOX thickness (total thickness) in the SOI structure can be accomplished by forming the silicon oxide film in the supporting wafer side.

The type of the active layer wafer and the supporting wafer may include, for example, a monocrystal silicon wafer, a gallium arsenide wafer and the like.

The insulating film may include an oxide film, a nitride film and the like.

In the manufactured bonded wafer, the total thickness of the insulating film (the buried insulating film) is not limited. It may be in a range of 0.1 μm to 0.5 μm, for example.

The thickness of the active layer is not limited. For example, the thickness of the active layer of thick film may be in a range of 1 μm to 2 μm. The thickness of the active layer of thin film may be in a range of 0.01 μm to 1 μm. The present invention is preferably applicable to the bonded wafer having the active layer of thin film. The ratio of the thickness of the insulating film formed in the active layer wafer to the thickness of the insulating film formed in the supporting wafer is not limited.

The light element may include, for example, helium (He), neon (Ne), argon (Ar), krypton (Kr), xenon (Xe) and radon (Rn), which are the noble gas element, in addition to the hydrogen (H). Those elements may be provided in a single element or as a component of the chemical compound.

The dose of the light element used in the ion implantation is not limited. For example, the dose may be in a range of $2 \times 10^{16}$ atoms/cm$^2$ to $8 \times 10^{16}$ atoms/cm$^2$ The acceleration voltage used in the ion implantation of the light element may be not higher than 50 keV, preferably not higher than 30 keV and more preferably not higher than 20 keV. In the ion implantation of the light element, the light element can be more precisely controlled so that the light element can be concentrated in a depth of target by using the lower acceleration voltage, which is more advantageous in the production of the SOI of thin film, for example. However, the lower the acceleration voltage is, the greater the damage is, and that is the point where the present invention is profitable.

The heating temperature of the bonded wafer used for the cleavage is 400° C. or higher, preferably in a range of 400° C. to 700° C. and more preferably in a range of 450° C. to 550° C. It is difficult with the temperature lower than 400° C. to form the bubbles of light element from the light element which has been ion-implanted into the active layer wafer. Inversely, with the temperature higher than 700° C., the oxide deposit will be formed within the active layer and it may deteriorate the properties of devices.

The heating time of the bonded wafer for the cleavage may be one minute or longer, preferably in a range of 10 minutes to 60 minutes. With the heating time less than one minute, it is difficult to form the bubbles of light element which has been ion-implanted into the bonded wafer.

In the bonding of the active layer wafer with the supporting wafer, for example, the two wafers are superposed one on the other in a room temperature and subsequently subjected to the teat treatment for enhancing the bonding strength to thereby improve the bonding strength therebetween. The heating temperature used in this step is 800° C. or higher, for example, 1100° C. The duration of the heat treatment for enhancing the bonding strength may be two hours, for example. The atmospheric gas in the furnace for the thermal oxidation may use nitrogen and the like.

A second invention provides a method for manufacturing a bonded wafer as defined in the first invention, in which a thickness of the insulating film of the active layer wafer, tdox, satisfies the following formula:

$$tdox < (1/9) \times tsoi,$$

where tsoi=thickness of the active layer.

As the insulating film of the active layer wafer becomes thicker, the variation range in thickness of the active layer of the manufactured bonded wafer becomes greater. If the thickness of the insulating film of the active layer wafer exceeds one-ninth of the active layer thickness (tsoi) after the cleavage, then the variation range in thickness of the active layer after the cleavage becomes higher than 10%, wherein it seems to be difficult from the consideration of the variation in the subsequent polishing step to accomplish the target thickness variation of 10% in the active layer of a finished product. Further, for the case of the active layer wafer including no insulating film (the insulating film formed exclusively in the supporting wafer), the interface between the active layer and the buried insulating film would be no more such an interface composed of two insulating films. In this case, if there exists any particle contamination or the like in the bonding interface, the mobility of electrons tends to be lowered in the vicinity of the BOX interface in the active layer, which inhibits obtaining the stable SOI properties.

A preferred thickness of the insulating film may be in a range of 0.05 μm to 1.0 μm. The thickness thinner than 0.05 μm may lead to a too thin insulating film, so that the insulating film in the active layer wafer could disappear during the cleaning after the ion implantation or before the bonding with the supporting wafer.

A third invention provides a method for manufacturing a bonded wafer as defined in the first or the second invention, in which the active layer wafer and the supporting wafer are subjected to a plasma treatment, respectively, before the bonding step of the active layer wafer with the supporting wafer. The plasma treatment is intended to activate the surfaces of those wafers.

According to the third invention, the bonding of the oxide film with the oxide film embodying the present invention tends to reduce the bonding strength and thus to develop a defect (void) resultant from the insufficient bonding strength, as compared to the bonding of the silicon with the oxide film according to a typical practice. Therefore, in order to improve the bonding strength, the activation process with plasma (in oxygen gas atmosphere or nitrogen gas atmosphere) may be applied before the bonding step.

A fourth invention provides a method for manufacturing a bonded wafer as defined in the third invention, in which the plasma treatment is carried out in a plasma generated in an atmosphere of oxygen gas or nitrogen gas by holding the wafers at a temperature of 400° C. or lower for ten seconds or longer.

Effect of the Invention

According to the first to the fourth invention, since the thickness of the insulating film of the active layer wafer has been made thinner than the thickness of the buried insulating film of the bonded wafer, therefore even if the variation range in the in-plane thickness of the insulating film is large at the step of the ion implantation of the light element, the uniformity in the in-plane thickness of the active layer of the bonded wafer obtained in the smart cut method can be still improved.

Furthermore, since the thickness of the insulating film of the active layer wafer is reduced, the depth of the ion implantation is relatively deep, so that the damage to the buried insulating film resultant from the ion implantation of the light element present in the vicinity of the surface of the wafer can be reduced.

Figure 1:
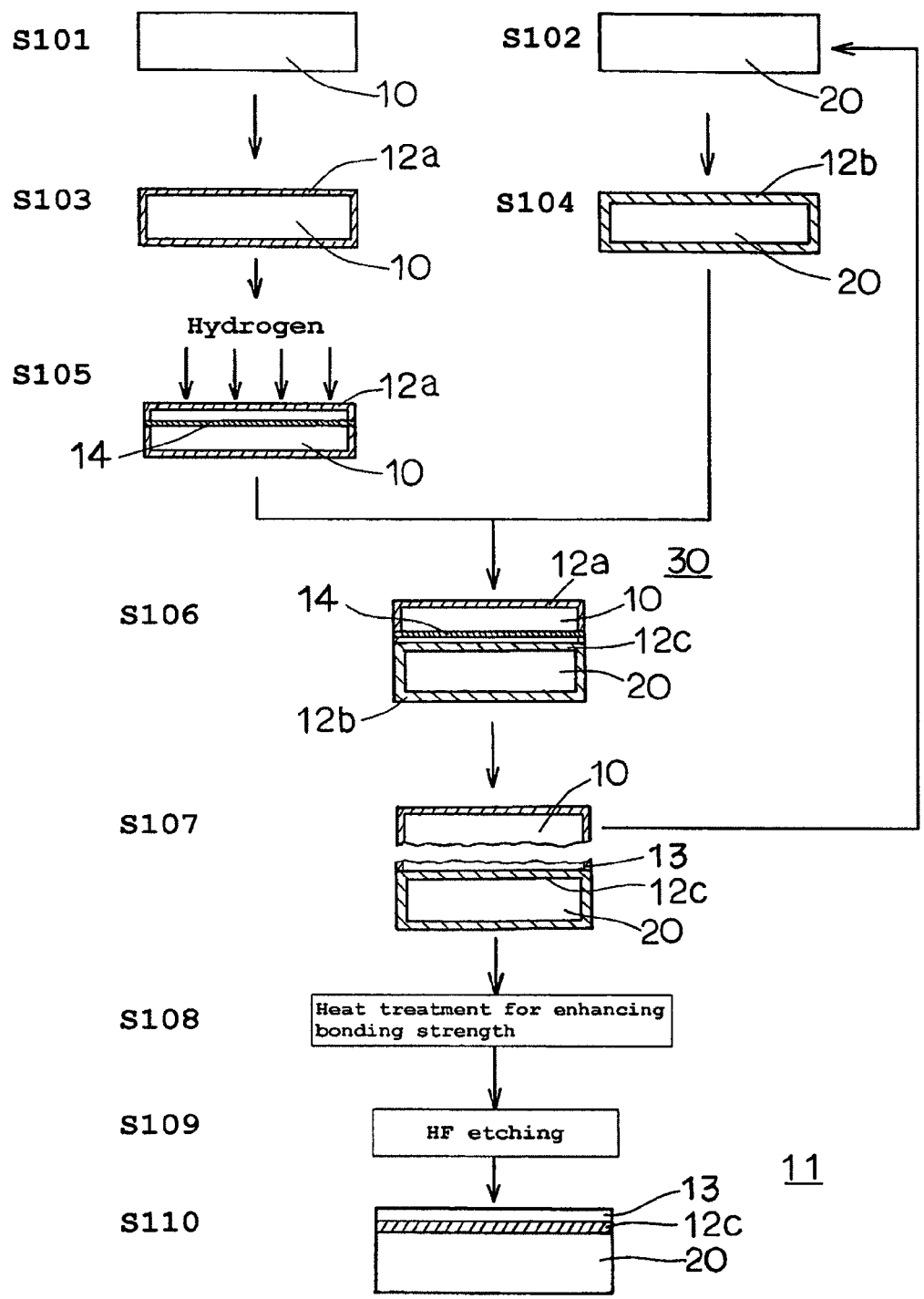
FIG. 1 is a flow sheet showing a method for manufacturing a bonded wafer according to a first embodiment of the present invention.

| Description of reference numeral | |
|---|---|
| 10 | Active layer wafer |
| 12a, 12b | Silicon oxide film (Insulating film) |
| 12c | Buried silicon oxide film (Insulating film) |
| 13 | Active layer |
| 14 | Hydrogen ion implanted area (Ion-implanted area) |
| 20 | Supporting wafer |
| 30 | Bonded wafer |

DESCRIPTION OF THE PREFERRED EMBODIMENTS

Preferred embodiments of the present invention will now be described with reference to the attached drawings.

First Embodiment

Firstly, a monocrystal ingot of silicon of p-type that has been doped with a predetermined quantity of boron is pulled up in the Cz method. This monocrystal ingot of silicon undergoes a series of processing comprising block cutting, slicing, beveling and mirror polishing. Those steps of processing produce a wafer to be prepared as an active layer wafer 10 and a wafer to be prepared as a supporting wafer 20, each of which wafers is of p-type and mirror-polished at its single side and has a thickness of 725 μm, a diameter of 200 mm and a specific resistance of 10Ωcm to 20Ωcm (see step S101 and step S102 of FIG. 1).

Following that step, the two wafers 10 and 20 are subjected to thermal oxidation in an atmosphere of oxygen gas so as to form a silicon oxide film 12a, 12b entirely over an exposed surface of each of the wafers 10, 20, as shown in step S103 and step S104 of FIG. 1. The condition of the thermal oxidation may be defined, for example, by the thermal treatment at 700° C. for 20 hours for the active layer wafer 10 and at 1000° C. for six hours for the supporting wafer 20 in the test example 1 shown in Table 1, which will be referred to later. The thickness of the silicon oxide film 12a is 0.01 μm (substantially equivalent to 2% of a desired thickness of the active layer 13) and the thickness of the silicon oxide film 12b is 0.14 μm. The thickness of the silicon oxide film 12a, 12b may vary in dependence on each specific oxidation temperature and process time.

Subsequently, an intermediate current ion implanting device is used to perform the ion implantation of the hydrogen with an acceleration voltage of 50 keV into the active layer wafer 10 via its mirror finished surface at a predetermined depth measured therefrom, as shown in step S105 of FIG. 1. Thus the hydrogen ion implanted area 14 is formed in the active layer wafer 10. In this step, the dose is $5 \times 10^{16}$ atoms/cm$^2$, and the depth of ion implantation (Rp) is about 0.5 μm.

Following that step, the active layer wafer 10 and the supporting wafer 20 may be subjected to a plasma treatment prior to the step of bonding. In the plasma treatment, the plasma of reactive gas is generated in an atmosphere of oxygen or nitrogen and those wafers may be held in thus generated plasma at the room temperature for 30 seconds, for example. An effect from the plasma treatment resides in that by removing any impurities (e.g., organic substances) deposited on the surfaces of the oxide films 12a and 12b provided on the active layer wafer 10 and the supporting wafer 20, respectively, those surfaces of the oxide films 12a, 12b can be activated so as to enhance the bonding strength therebetween as compared to the case of bonding with no plasma treatment provided. Regarding the bonding, typically the connecting strength in the bonding of an oxide film with another oxide film is lower than the bonding of silicon with an oxide film, which could problematically inhibit the cleavage in the smart cut method and lead to a lowered yield, but the above-discussed plasma treatment, if added to the flow of processing, can improve the bonding strength and achieve a high quality of a manufactured bonded wafer without deteriorating the yield. It is to be noted that, based on the fact that the plasma treatment at a temperature higher than 400° C. could cause a cleavage in the active layer wafer at the site of the ion-implanted layer, the plasma treatment should be carried out at any properly determined temperature which would never induce a cleavage in the active layer wafer after the ion implantation.

Figure 2:
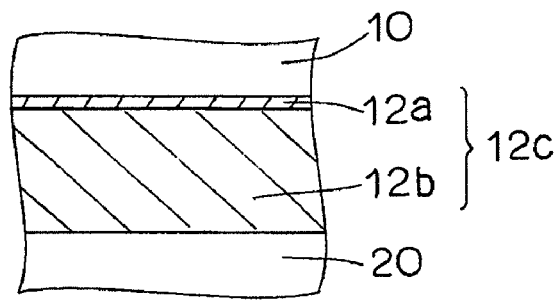
FIG. 2 is an enlarged view showing a site of bonding between an active layer wafer and a supporting wafer in an enlarged size.
Figure 3:
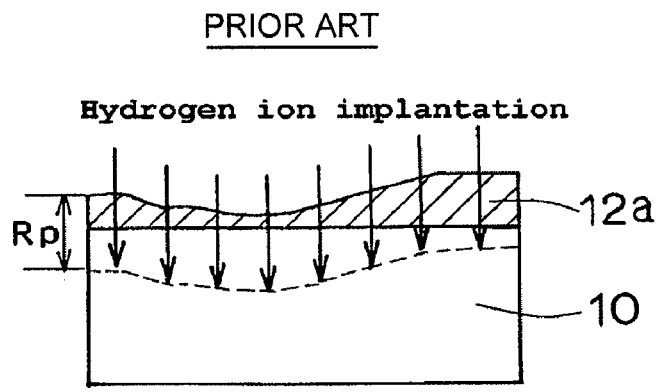
FIG. 3 is a sectional view of an active layer wafer showing a correlation between the uniformity in film thickness of a buried insulating film and the uniformity in film thickness of an active layer according to a means of the prior art.
Figure 4:
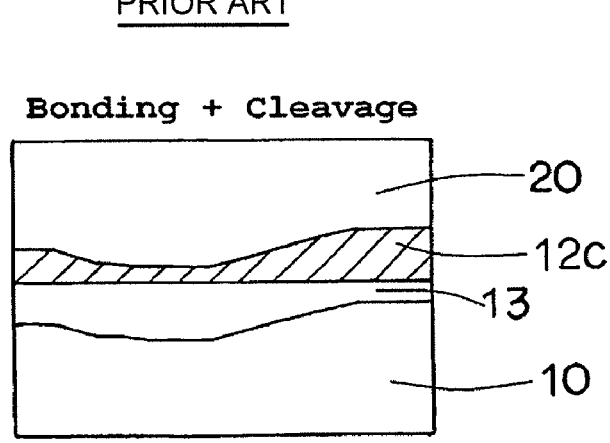
FIG. 4 is a sectional view of a bonded wafer showing a correlation between the uniformity in film thickness of a buried insulating film and the uniformity in film thickness of an active layer according to a means of the prior art.
Figure 5:
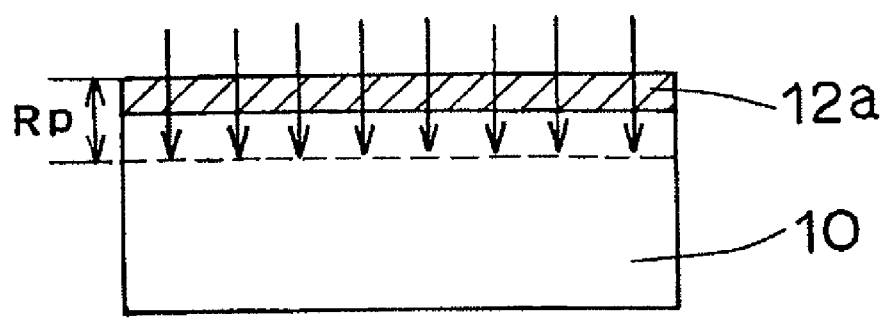
FIG. 5 is a sectional view of an active layer wafer showing a correlation between the uniformity in film thickness of a buried insulating film and the uniformity in film thickness of an active layer according to the present invention.
Figure 6:
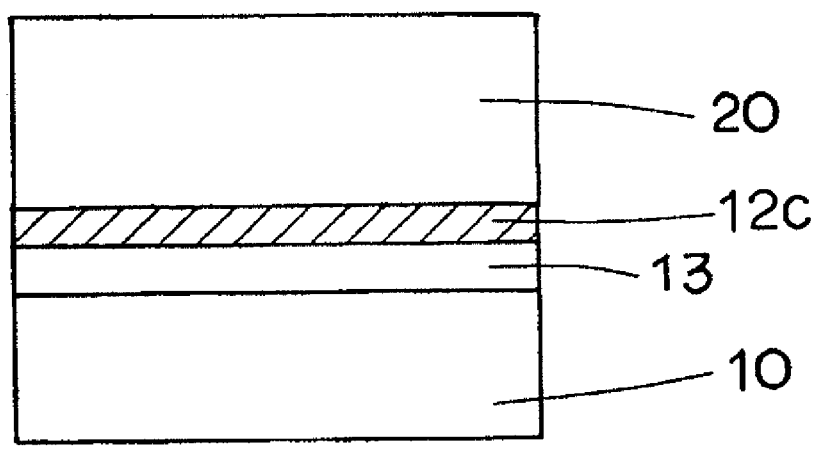
FIG. 6 is a sectional view of a bonded wafer showing a correlation between the uniformity in film thickness of a buried insulating film and the uniformity in film thickness of an active layer according to the present invention.

Subsequently, the active layer wafer 10 and the supporting wafer 20 are bonded together by using the surface of the active layer wafer 10 and the mirror-polished surface of the supporting wafer 20 as the bonding surfaces (the superposed surfaces) with the silicon oxide films 12a and 12b interposed therebetween with a known jig in a vacuum unit, for example, thus to produce the bonded wafer 30, as shown in step S106 of FIG. 1. In this step, the silicon oxide films 12a and 12b are connected to each other between the active layer wafer 10 and the supporting wafer 20 to be formed into a buried silicon oxide film 12c, as shown in FIG. 2.

Then, the bonded wafer 30 is introduced into a thermal treatment device for cleavage, though not shown, and heat treated in an atmosphere of N$_2$ gas (or argon gas or oxygen gas) at a furnace temperature of 500° C., as shown in step S107 of FIG. 1. The duration of heat treatment is 30 minutes. This provides such a low-temperature heat treatment in which a part of the active layer wafer 10 is cleaved and separated from the bonded wafer 30 at the site of the hydrogen ion implanted area 14 while leaving the active layer 13 on the bonding interface of the supporting wafer 20 side. It is also possible to reuse the part of the active layer wafer 10, which has been cleaved off from the bonded wafer 30, as the silicon wafer serving as the supporting wafer 20 for the subsequent manufacturing process.

After the step of cleavage and separation, the bonded wafer 30 undergoes a heat treatment at 1100° C. for two hours. As a result, the bonding strength between the active layer wafer 12a and the supporting wafer 20 can be further enhanced.

Then, the bonded wafer 30 of SOI structure is dipped in a 50-weight-percent HF solution for one minute (at room temperature) so that the silicon oxide film 12a remaining in an outer peripheral portion of the active layer 13 and the silicon oxide film 12b on the outer surface of the supporting wafer 20 may be subjected to the HF etching, as shown in step S109 of FIG. 1. Following this step, the surface of the active layer 13 is polished by a polishing device, as shown in step S110 of FIG. 1. Thus, the bonded SOI wafer 11 processed by the smart cut method has been manufactured (see step S110 of FIG. 1)

As described above, since the thickness of the silicon oxide film 12a of the active layer wafer 10 is controlled to be thinner than the buried silicon oxide film 12c of the bonded wafer 30, therefore the uniformity in the in-plane thickness of the active layer 13 can be improved, even if the variation in the in-plane thickness of the silicon oxide film 12a is high at the step of time of the hydrogen ion implantation.

Furthermore, since the silicon oxide film 12a has been made thinner and thereby the depth of hydrogen ion implantation is controlled to be relatively deeper, therefore the damage to the buried silicon oxide film 12c from the ion implantation can be reduced.

A report on a result obtained from a comparison and examination with respect to the method in accordance with the present invention and the prior art method, respectively, will be herein presented specifically on the uniformity in film thickness of the active layer after the cleavage and the etching rate in the buried silicon oxide film.

The uniformity in film thickness of the active layer was measured by using an ellipsometer. The etching rate of the buried silicon oxide film (the silicon oxide film in the active layer wafer side+the silicon oxide film in the supporting wafer side) was represented by the etching rate obtained by using a one-weight-percent HF solution for etching at 20° C. for one minute. Table 1 shows the result.

It is to be noted that the BOX indicates the buried silicon oxide film 12c, the tdox indicates the thickness of the oxide film 12a of the active layer wafer, and the tsoi indicates the thickness of the active layer 13, respectively in Table 1. Further, the uniformity in the active layer after the cleavage was determined by the following formula.

(Variation in the active layer after the cleavage/Thickness of SOI after the cleavage)×100(%)

TABLE 1

| | BOX thickness of active layer substrate (μm) | BOX thickness of supporting substrate (μm) | tdox/tsoi | Active layer uniformity after cleavage (%) | Etching rate of BOX layer |
|---|---|---|---|---|---|
| Test example 1 | 0.01 | 0.14 | 0.03 | 4 | 1.02 |
| Test example 2 | 0.03 | 0.12 | 0.10 | 7 | 1.05 |
| Comparative example 1 | 0.05 | 0.10 | 0.16 | 12 | 1.11 |
| Comparative example 2 | 0.07 | 0.08 | 0.23 | 17 | 1.15 |
| Comparative example 3 | 0.15 | 0 | 0.5 | 21 | 1.16 |

As apparent from Table 1, the uniformity in film thickness of the active layer after the cleavage has been successfully improved in both of the test examples 1 and 2, in which the relation defined by tdox/tsoi is lower than 1/6, as compared to the comparative example 1 to 3. Further, the etching rate of the buried silicon oxide film in the test examples 1 and 2 has been demonstrated substantially equal to the etching rate of the thermal oxidation film with no ion implantation applied (the etching rate in this case is taken as 1).

What is claimed is:

1. A method for manufacturing a bonded wafer, comprising:
    ion-implanting a light element into a wafer for active layer at a predetermined depth via an insulating film that has been formed thereon to form an ion-implanted area in said active layer wafer;
    subsequently bonding said active layer wafer with a supporting wafer having an insulating film formed thereon together as their insulating films facing to each other to produce the bonded wafer; and
    heat treating said bonded wafer to form bubbles of said light element in said ion-implanted area and thereby induce a cleavage and separation of a part of said bonded wafer defined in said ion-implanted side for forming an active layer wherein
    a thickness of said insulating film of said active layer wafer, tdox, satisfies the following formula:

$$tdox < (1/6) \times tsoi,$$

where tsoi=thickness of said active layer, and wherein the thickness of said active layer is approximately 333 nm or less.

2. A method for manufacturing a bonded wafer in accordance with claim 1, in which
    said active layer wafer and said supporting wafer are subjected to a plasma treatment, respectively, before said bonding of said active layer wafer with said supporting wafer.

3. A method for manufacturing a bonded wafer in accordance with claim 2, in which the thickness of said insulating film of said active layer is between 10 nm and 30 nm.

4. A method for manufacturing a bonded wafer in accordance with claim 1, in which the thickness of said insulating film of said active layer is between 10 nm and 30 nm.

* * * * *